US008987875B2

(12) United States Patent
Berlin et al.

(10) Patent No.: US 8,987,875 B2
(45) Date of Patent: Mar. 24, 2015

(54) BALANCED STRESS ASSEMBLY FOR SEMICONDUCTOR DEVICES

(71) Applicant: Delphi Technologies, Inc., Troy, MI (US)

(72) Inventors: Carl W. Berlin, West Lafayette, IN (US); Gary L. Eesley, Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 201 days.

(21) Appl. No.: 13/789,722

(22) Filed: Mar. 8, 2013

(65) Prior Publication Data

US 2014/0252578 A1 Sep. 11, 2014

(51) Int. Cl.
*H01L 23/495* (2006.01)
*H01L 21/00* (2006.01)
(Continued)

(52) U.S. Cl.
CPC .......... *H01L 23/49575* (2013.01); *H01L 24/06* (2013.01); *H01L 23/49531* (2013.01); *H01L 23/49861* (2013.01); *H01L 2224/75981* (2013.01); *H01L 23/3735* (2013.01); *H01L 23/49537* (2013.01); *H01L 23/562* (2013.01); *H01L 24/27* (2013.01); *H01L 24/29* (2013.01); *H01L 24/32* (2013.01); *H01L 24/33* (2013.01); *H01L 24/75* (2013.01); *H01L 24/83* (2013.01);
(Continued)

(58) Field of Classification Search
CPC ................... H01L 23/49861; H01L 23/49537; H01L 23/49575; H01L 24/83; H01L 24/06; H01L 23/49531; H01L 23/49541; H01L 23/4951

See application file for complete search history.

(56) References Cited

U.S. PATENT DOCUMENTS 3,825,803 A 7/1974 Budde
4,801,561 A 1/1989 Sankhagowit
(Continued)

FOREIGN PATENT DOCUMENTS

DE 103 03 103 A1 8/2004
DE 10 2010 001666 A1 8/2011
(Continued)

OTHER PUBLICATIONS

"Chapter 2: Niedertemperatur-Verbindungstechnik" In: Klaka S: "Eine Niedertemperatur-verbindungstechnik Zum Aufbau Von Leistungshalbleitermodulen", 1997, Cuvillier Verlag, Gottingen, Germany, XP001526262, ISBN: 3-89588-771-4 pp. 5-8.
(Continued)

*Primary Examiner* — Alonzo Chambliss
(74) *Attorney, Agent, or Firm* — Lawrence D. Hazelton

(57) ABSTRACT

An assembly for packaging one or more electronic devices in die form. The assembly includes substrates on opposite sides of the assembly, with lead frames between the electronic devices and the substrates. The substrates, lead frames, and electronic devices are sintered together using silver-based sintering paste between each layer. The material and thicknesses of the substrates and lead frames are selected so stress experienced by the electronic devices caused by changes in temperature of the assembly are balanced from the center of the assembly, thereby eliminating the need for balancing stresses at a substrate level by applying substantially matching metal layers to both sides of the substrates.

6 Claims, 2 Drawing Sheets

(51) Int. Cl.
*H05K 7/00* (2006.01)
*H05K 3/30* (2006.01)
*H01L 23/00* (2006.01)
*H01L 23/498* (2006.01)
*H01L 23/373* (2006.01)

(52) U.S. Cl.
CPC .............. *H01L 2224/2732* (2013.01); *H01L 2224/29339* (2013.01); *H01L 2224/32245* (2013.01); *H01L 2224/33181* (2013.01); *H01L 2224/83203* (2013.01); *H01L 2224/83439* (2013.01); *H01L 2224/8384* (2013.01); *H01L 2924/1203* (2013.01); *H01L 2924/13055* (2013.01); *H01L 2924/3511* (2013.01); *H01L 2224/29294* (2013.01)
USPC .......... 257/672; 257/676; 257/692; 257/762; 438/109; 438/123; 361/760; 361/772; 361/813; 29/832; 29/843; 29/854

(56) References Cited

U.S. PATENT DOCUMENTS

| | | | |
|---|---|---|---|
| 5,304,847 A | 4/1994 | Neugebauer et al. | |
| 6,437,449 B1 * | 8/2002 | Foster | 257/777 |
| 6,521,982 B1 * | 2/2003 | Crowley et al. | 257/676 |
| 6,650,019 B2 * | 11/2003 | Glenn et al. | 257/777 |
| 6,707,138 B2 * | 3/2004 | Crowley et al. | 257/676 |
| 6,873,059 B2 | 3/2005 | Amagai et al. | |
| 2005/0131336 A1 | 6/2005 | Mori et al. | |
| 2012/0152510 A1 | 6/2012 | Noda et al. | |
| 2012/0222960 A1 | 9/2012 | Kumar et al. | |
| 2014/0061884 A1 * | 3/2014 | Carpenter et al. | 257/676 |
| 2014/0117523 A1 * | 5/2014 | Ho et al. | 257/676 |

FOREIGN PATENT DOCUMENTS

| | | |
|---|---|---|
| EP | 1 973 157 A1 | 9/2008 |
| EP | 2 224 481 A1 | 9/2010 |
| JP | 2009 070863 A | 4/2009 |
| WO | 2010/081465 A2 | 7/2010 |

OTHER PUBLICATIONS

"Chapter 3: Der Verbindugnsmechanismus" In: Klaka S: "Eine Niedertemperatur-Verbindungstechnik Zum Aufbau Von Leistungshalbleitermodulen", 1997, Cuvillier Verlag, Gottingen, Germany, XP001526263, ISBN: 3-89588-771-4 pp. 9-41.
European Search Report dated Jun. 30, 2014.

* cited by examiner

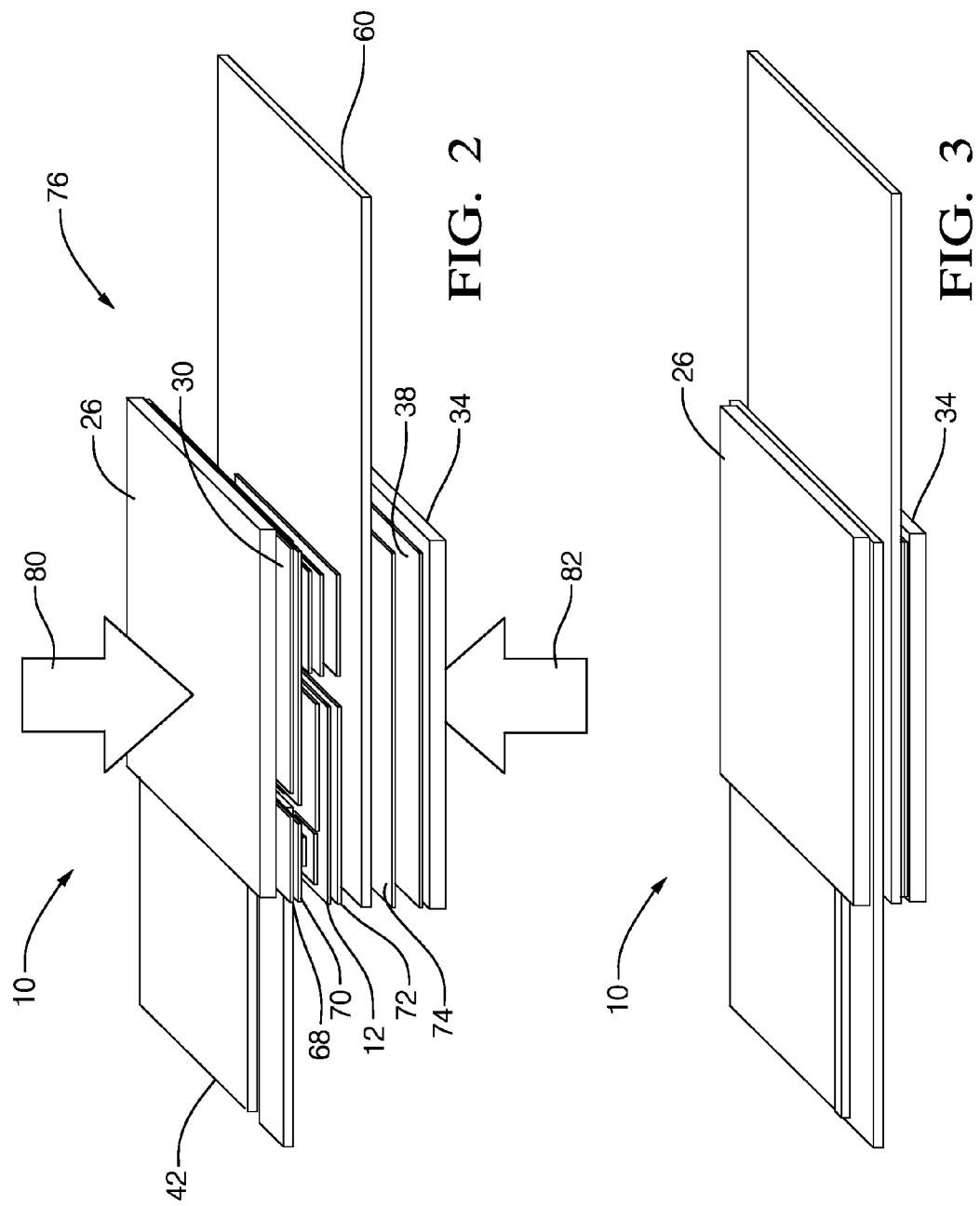

BALANCED STRESS ASSEMBLY FOR SEMICONDUCTOR DEVICES

TECHNICAL FIELD OF INVENTION

This disclosure generally relates to an assembly for packaging electronic devices in die form, and more particularly relates to a way to configure the assembly so stress experienced by the electronic devices caused by changes in temperature are balanced from the center of the assembly where the electronic devices are located.

BACKGROUND OF INVENTION

High power packages for one or more semiconductor devices such as transistors and diodes have been proposed. One configuration is to place a planar arrangement of semiconductor devices in die form and lead frames upon one metalized substrate, and then place a second metalized substrate over the planar arrangement of semiconductors and lead frames. Direct bond aluminum (DBA) or direct bond copper (DBC) substrates are commonly used that have ceramic cores with a substrate metallization applied to the core prior to assembly with the semiconductor devices and lead frames. The substrate metallization must be thick enough to carry high current (e.g. >10 A) between the semiconductors and the lead frames, and applying a layer that is thick enough is costly. In addition, DBA and DBC substrates for such arrangements must be stress balanced by similar patterns of substrate metallization on both sides of the core to alleviate substrate warping, even if this stress balancing layer is not used to conduct electricity.

Furthermore, the semiconductor devices, an insulated gate bipolar transistor (IGBT) and a diode for example, should be the same thickness as lead frames to provide coplanar bonding-surfaces for the second substrate. However, lead frames with the same thickness as typical semiconductor devices are flimsy, and therefore difficult to handle. If the thickness of the semiconductor devices is increased to match an easy to handle lead frame, the cost and thermal resistance of the semiconductor device are undesirable increased. As such, power packages are typically assembled using lead free solder to overcome thickness variations. However, thick solder joints provide poor thermal and electrical conductivity.

SUMMARY OF THE INVENTION

Described herein is an electronic device package configuration or assembly for semiconductor electronic devices in die form (e.g. IGBT, diode) that replaces the thick metallization applied to the substrate described above with a thin metallization applied to one side of the substrate to provide a surface for low temperature sintering. Because the metallization is thin, between one micrometer (1 um) and twenty-five micrometer (25 um) for example, the metallization does not warp the substrate. Copper or Aluminum lead frames that extend into the package are sintered directly to semiconductor devices and substrate to provide a high current conductor capable of conducting currents greater than ten Amperes (10 A), for example. The package or assembly is stress balanced from the center of the assembly, thereby eliminating the need for stress balancing metallization applied to both sides of the substrate.

In accordance with one embodiment, an assembly for packaging electronic devices is provided. The assembly includes one or more electronic devices, a first substrate, a first metal layer, a second substrate, a second metal layer, a first lead frame, a second lead frame, a first paste layer of silver, a second paste layer of silver, a third paste layer of silver, and a fourth paste layer of silver. The one or more electronic devices are arranged in a coplanar orientation that defines a plane having a first side and a second side. The one or more electronic devices also define an arrangement area determined by the planar extents of the one or more electronic devices. The first substrate is electrically coupled to the first side. The first substrate is formed of one of aluminum nitride (AlN), aluminum oxide (Al2O3), and silicon nitride (Si3N4). The first substrate defines a first area that encompasses the arrangement area. The first metal layer is applied only to an inner surface of the first substrate. The inner surface of the first substrate is characterized as oriented toward the first side. The first metal layer has a thickness between one micrometer (1 um) and twenty-five micrometer (25 um). The first metal layer is formed of a material suitable for bonding with silver (Ag) based sintering paste. The second substrate is electrically coupled to the second side. The second substrate is formed of substantially the same material with substantially the same thickness as the first substrate. The second substrate defines a second area that substantially matches the first area. The second metal layer is applied only to an inner surface of the second substrate. The inner surface of the second substrate is characterized as oriented toward the second side. The second metal layer has a thickness of between one micrometer (1 um) and twenty-five micrometer (25 um). The second metal layer is formed of a metal suitable for bonding with silver (Ag) based sintering paste. The first lead frame is interposed between the one or more electronic devices and the first substrate. The first lead frame has a surface material suitable for bonding with silver (Ag) based sintering paste. The first lead frame defines a first contact portion that corresponds to the first area of the first substrate, and a first lead portion that extends beyond the first area in a first direction. The second lead frame is interposed between the one or more electronic devices and the second substrate. The second lead frame has a surface material suitable for bonding with silver (Ag) based sintering paste. The second lead frame defines a second contact portion that corresponds to the second area of the second substrate, and a second lead portion that extends beyond the second area in a second direction distinct from the first direction. The first paste layer of silver (Ag) based sintering paste interposed between the first substrate and the first lead frame. The first paste layer configured to form an electrical connection between the first substrate and the first lead frame. The second paste layer of silver (Ag) based sintering paste is interposed between the first lead frame and the one or more electronic devices. The second paste layer is configured to form an electrical connection between the first lead frame and electrodes on the first side of the one or more devices. The third paste layer of silver (Ag) based sintering paste is interposed between the second lead frame and the one or more electronic devices. The third paste layer is configured to form an electrical connection between the second lead frame and electrodes on the second side of the one or more electronic devices. The fourth paste layer of silver (Ag) based sintering paste is interposed between the second substrate and the second lead frame. The fourth paste layer is configured to form an electrical connection between the second substrate and the second lead frame.

Further features and advantages will appear more clearly on a reading of the following detailed description of the preferred embodiment, which is given by way of non-limiting example only and with reference to the accompanying drawings.

BRIEF DESCRIPTION OF DRAWINGS

The present invention will now be described, by way of example with reference to the accompanying drawings, in which:

FIG. 2 is a partially exploded view of the electronic device assembly of FIG. 1 illustrating how a force is applied to facilitate sintering in accordance with one embodiment; and FIG. 3 is perspective view of the electronic device assembly of FIG. 1 after sintering in accordance with one embodiment.

DETAILED DESCRIPTION

Figure 1:
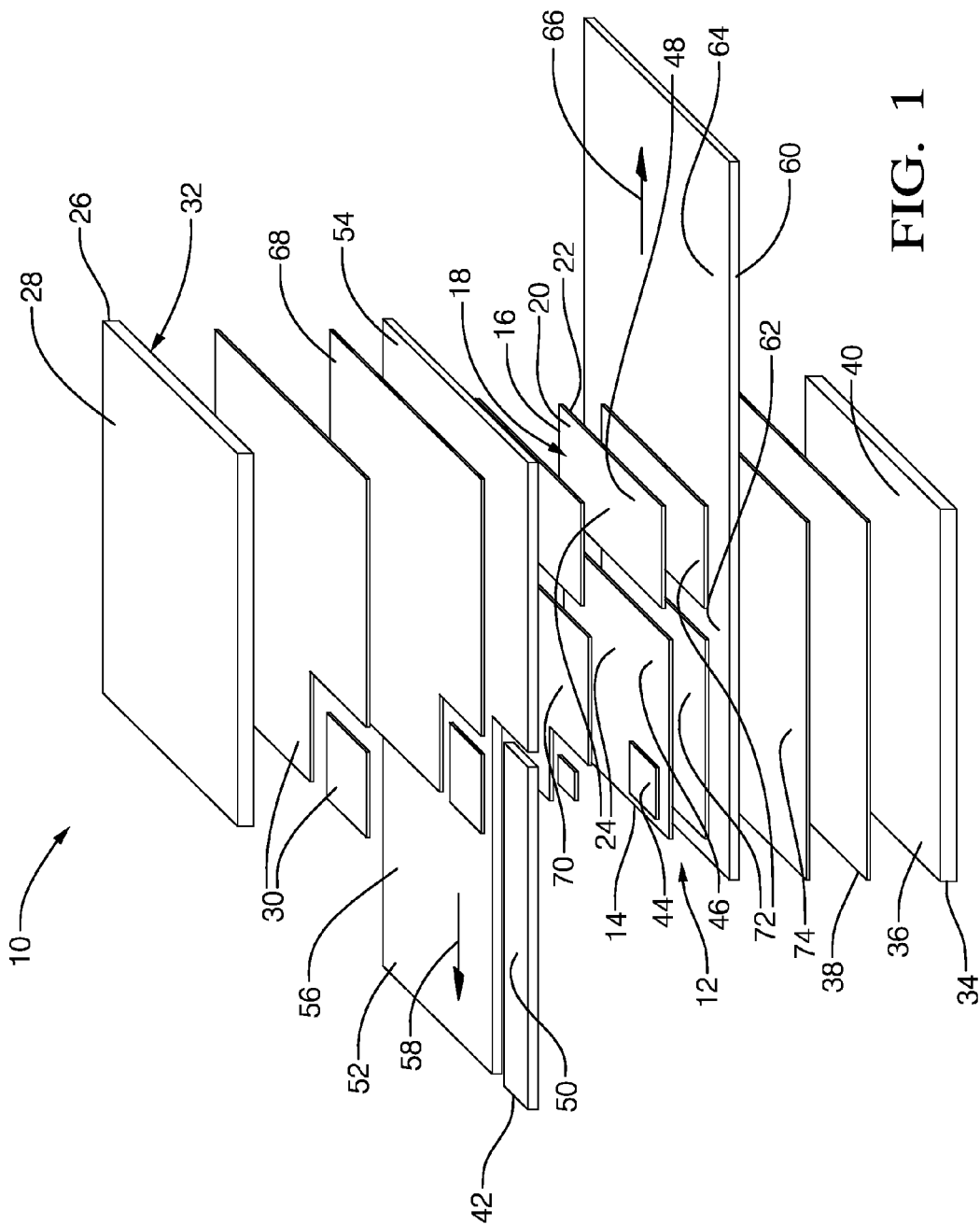
FIG. 1 is a perspective exploded view of an electronic device assembly in accordance with one embodiment.

FIG. 1 illustrates a non-limiting example of an electronic device assembly, hereafter the assembly 10, for one or more electronic devices 12. In this example, the electronic devices 12 are an insulated gate bipolar transistor (IGBT) 14 and a diode 16 arranged in a coplanar orientation. This coplanar arrangement defines a plane 18 having a first side 20 and a second side 22, and defines an arrangement area 24 determined by the planar extents of the electronic devices 12. As used herein, the planar extents of the electronic devices 12 is defined by the perimeter of the area occupied by the electronic devices 12.

The assembly 10 also includes a first substrate 26 coupled to the first side 20 of the electronic devices 12 in a manner that will be explained in more detail below. The first substrate 26 is preferably formed of one of aluminum nitride (AlN), aluminum oxide (Al2O3), and silicon nitride (Si3N4), although other suitable materials may be used. A characteristic of a suitable substrate material would be a material that has a coefficient of thermal expansion (CTE) similar to the CTE of the electronic devices 12, for example within a few parts per million per degree Celsius (ppm/° C.). By way of example and not limitation, a suitable AlN substrate thickness is six-hundred-thirty-five micrometers (635 μm or 0.635 mm). If a substrate is too thin, it may break during assembly processing. In contrast, if a substrate is too thick, it adds unnecessary thermal resistance to the assembly 10. The first substrate 26 defines a first area 28 that generally encompasses the arrangement area 24. That is, the first area 28 is typically larger than the arrangement area 24 of the electronic devices 12, but typically no larger than necessary to protect the electronic devices 12 when the assembly 10 is finished.

The assembly 10 also includes a first metal layer 30 applied only to an inner surface 32 of the first substrate 26. The metal layer is preferably applied to the substrate prior to arranging the parts described herein that make up the assembly 10. Typically, the substrate is purchased with the metal layer already applied, or the metal layer is applied in a separate manufacturing operation. As used herein, the inner surface 32 of the first substrate 26 corresponds to the side of the first substrate 26 that is oriented toward the first side 20 of the electronic devices 12. In this example, the first metal layer 30 has a thickness between one micrometer (1 um) and twenty-five micrometer (25 um). The first metal layer is preferably formed of a material suitable for bonding with silver (Ag) based sintering paste. Suitable materials for the first metal layer 30 include, but are not limited to, silver (Ag), gold (Au), and silver/copper/titanium (Ag/Au/Ti) alloys. Preferably, the first metal layer 30 is applied using sputtering or other known thin film application techniques so the thickness and uniformity of the first metal layer 30 can be readily controlled. However, other application methods will be recognized by those in the art to apply the first metal layer 30 thin enough so as to not cause substantial warping of the first substrate 26 over a wide range of temperature, minus-sixty-five degrees Celsius (−65° C.) to three hundred degrees Celsius (300° C.), for example. As used herein, substantial warping is characterized as sufficient warping to cause damage to the assembly 10.

The assembly 10 also includes a second substrate 34 coupled to the second side of the electronic devices 12 in a manner that will be explained in more detail below. Preferably, the second substrate 34 is formed of substantially the same material with substantially the same thickness as the first substrate 26. As used herein, substantially the same material and substantially the same thickness means that any material differences or thickness difference are generally due to manufacturing variation and not because a distinct material or a different thickness was selected for the second substrate 34. In addition, it is preferable that the second substrate defines a second area 36 that substantially matches the first area 28. As used herein, 'substantially matches' generally means that any dimensional differences are generally due to manufacturing variability and not intentional design differences. However, the prior instances of 'substantially' do not exclude the first substrate 26 and the second substrate 34 having different materials or dimensions. A key feature is that the assembly 10 is configured so stress experienced by the electronic devices 12 or the assembly 10 caused by changes in temperature of the assembly 10 are balanced from the center of the assembly 10 (i.e. the plane 18). Having the assembly 10 balanced from the center generally eliminates the need for balancing stresses at a substrate level by applying substantially matching metal layers to both sides of the substrates.

The assembly 10 also includes a second metal layer 38 applied only to an inner surface 40 of the second substrate 34, where the inner surface 40 is characterized as oriented toward the second side 22 of the electronic devices 12. Like the first metal layer 30, the second metal layer 38 preferably has a thickness of between one micrometer (1 um) and twenty-five micrometer (25 um), and the second metal layer 38 is formed of a metal suitable for bonding with silver (Ag) based sintering paste. While it is preferable for the first metal layer 30 and the second metal layer 38 to have substantially the same thickness, the thicknesses may be different as the range of preferred thickness is such that the metal layer does not substantially warp the substrate as temperature is varied.

The assembly 10 also includes a first lead frame 42 interposed between the electronic devices 12 and the first substrate 26. In this non-limiting example, the first lead frame 42 is shown as having two portions. Those skilled in the art will recognize that the first lead frame 42 may also include a cut-off portion that is not shown, but is present during the process of forming the assembly 10, and is cut off after the assembly 10 is formed. This cut-off portion is removed to isolate electrically the two portions illustrated so that multiple distinct electrical connections can be made to the electronic devices. By way of example and not limitation, in this example the first lead frame 42 includes a portion 50 that makes contact with a gate electrode 44 of the IGBT 14, and a portion 52 that makes contact with a source electrode 46 (i.e. emitter electrode) of the IGBT and an anode electrode 48 of the diode 16.

A suitable material for the first lead frame 42 is silver (Ag) plated copper or Ag plated aluminum so that the first lead frame 42 has a surface material suitable for bonding with a silver (Ag) based sintering paste. A suitable thickness for the first lead frame 42 is two-hundred-fifty micrometers (250 μm or 0.25 mm), and preferably has a thickness between one-hundred micrometers (100 μm or 0.1 mm) and five-hundred micrometers (500 μm or 0.5 mm). If the lead frame is too thin, it may be difficult to handle because it is flimsy. If the lead frame is too thick, material may be undesirably wasted, and subsequent forming or electrical attachment steps may become difficult. In general, the first lead frame 42 defines a first contact portion 54 that corresponds to the first area 28 of the first substrate 26, and a first lead portion 56 that extends beyond the first area 28 in a first direction 58. It will also be recognized by those skilled in the art that electrical connection from the lead portion of the lead frame to, for example, a circuit board assembly may be by way of, but not limited to, clamping, soldering, welding, or inserting the lead portion into a connector.

The assembly 10 also includes a second lead frame 60 interposed between the electronic devices 12 and the second substrate 34. Like the first lead frame 42, the second lead frame 60 preferable has a surface material suitable for bonding with silver (Ag) based sintering paste. In addition, the second lead frame 60 is preferably made of the same material having the same thickness as the first lead frame 42. In general, the second lead frame 60 defines a second contact portion 62 that corresponds to the second area 36 of the second substrate 34, and a second lead portion 64 that extends beyond the second area 36 in a second direction 66 distinct from the first direction 58. In this non-limiting example, the first direction 58 and the second direction 66 are opposite directions. However, other configurations are contemplated such as having the first direction 58 and the second direction 66 oriented at a right angle, or having a lead portion extend in more than on direction.

The assembly 10 also includes a first paste layer 68 of silver (Ag) based sintering paste interposed between the first substrate 26 and the first lead frame 42. In general, the first paste layer 68 is configured to form an electrical connection between the first substrate 26 and the first lead frame 42. The sintering paste preferably consists of silver particles mixed with an organic carrier to facilitate printing. Once the material is dried, (i.e. the organic carrier is evaporated) the remaining material forming the first paste layer 68 is essentially pure silver. While not subscribing to any particular theory, sintering is a known process that uses heat, and optionally pressure or force applied to the assembly 10 while the temperature is elevated atomic diffusion to encourage atomic diffusion by the silver particles and thereby bond the particles together and bond with the first substrate 26 and the first lead frame 42. Sintering paste is available from a number of electronic materials suppliers. The first paste layer 68 (and other paste layers described below) is typically applied using known screen-printing methods to a preferred thickness of one-hundred micrometers (100 μm or 0.1 mm).

The assembly 10 also includes a second paste layer 70 of silver (Ag) based sintering paste interposed between the first lead frame 42 and the electronic devices 12. Similar to the first paste layer 68, the second paste layer 70 is configured to form an electrical connection between the first lead frame 42 and electrodes on the first side 20 of the electronic devices 12.

The assembly 10 also includes a third paste layer 72 of silver (Ag) based sintering paste interposed between the second lead frame 60 and the electronic devices 12. Similar to the first paste layer 68, the third paste layer 72 is configured to form an electrical connection between the second lead frame 60 and electrodes on the second side 22 of the electronic devices 12.

The assembly 10 also includes a fourth paste layer 74 of silver (Ag) based sintering paste interposed between the second substrate 34 and the second lead frame 60. Similar to the first paste layer 68, the fourth paste layer 74 is configured to form an electrical connection between the second substrate 34 and the second lead frame 60.

FIG. 2 illustrates an exploded view of a non-limiting example of one embodiment where the assembly 10 is formed by arranging the one or more electronic devices 12, the substrates (the first substrate 26 and the second substrate 34) with the respective metal layers (the first metal layer 30 and the second metal layer 38) already applied to the substrates, the lead frames (the first lead frame 42 and the second lead frame 60), and the paste layers (the first paste layer 68, the second paste layer 70, the third paste layer 72, and the fourth paste layer 74) to form a stack 76. The stack 76 is shown as slightly exploded when compared to FIG. 1, but it should be understood that the various layers forming the stack 76 are in contact when a bond is formed between the layers to form the assembly 10. To bond all of these layers together, the stack 76 may be placed in a graphite boat or other suitable fixture known to those skilled in the art, and then heated to a temperature between, for example, two hundred degrees Celsius (200° C.) and three hundred degrees Celsius (300° C.). It should be recognized that 300° C. is below the melting temperature of silver (Ag), but is sufficiently elevated to promote sintering of the silver in the stack 76. If the stack 76 is heated to 250° C., then a suitable time interval for sintering is about ten minutes (10 min). Once the sintering is sufficient to bond the various layers together, the stack is removed from the source of heat and allowed to cool to a temperature suitable for subsequent handling and/or processing of the assembly 10, for example to a temperature less than one-hundred-twenty-five degrees Celsius (125° C.).

FIG. 3 illustrates a non-limiting example of the assembly 10 in finished form, ready for subsequent processing or testing, and/or attachment to a circuit board assembly. For example, the assembly 10 may be placed between heat sinks (not shown) that contact the first substrate 26 and the second substrate 34 to facilitate removing heat from the assembly 10.

Returning now to FIG. 2, the sintering process may be further promoted by applying a force to the assembly 10 while the temperature is elevated. Preferably, the force is applied prior to heating so that the force is present when sintering occurs. The force may be removed before or after the temperature is lowered, preferably after the sintering is complete. The direction of the force is illustrated by arrows 80, 82. The force value is preferably selected to generate a pressure less than thirty mega-Pascal (30 MPa). If too high a force is applied, the electronic devices 12 may be damaged.

Accordingly, an assembly 10 for packaging electronic devices is provided. The material and thicknesses of the substrates and lead frames are selected so stress experienced by the one or more electronic devices 12 caused by changes in temperature of the assembly 10 are balanced from the center (the plane 18) of the assembly 10, thereby eliminating the need for balancing stresses at a substrate level by applying substantially matching metal layers to both sides of the substrates.

While this invention has been described in terms of the preferred embodiments thereof, it is not intended to be so limited, but rather only to the extent set forth in the claims that follow.

We claim:

1. An assembly for packaging electronic devices, said assembly comprising:
one or more electronic devices arranged in a coplanar orientation that defines a plane having a first side and a second side, and defines an arrangement area determined by the planar extents of the one or more electronic devices;

a first substrate electrically coupled to the first side, said first substrate formed of one of aluminum nitride (AlN), aluminum oxide (Al2O3), and silicon nitride (Si3N4), wherein said first substrate defines a first area that encompasses the arrangement area;

a first metal layer applied only to an inner surface of the first substrate, said inner surface of the first substrate characterized as oriented toward the first side, wherein the first metal layer has a thickness between one micrometer (1 um) and twenty-five micrometer (25 um), and the first metal layer is formed of a material suitable for bonding with a silver (Ag) based sintering paste;

a second substrate electrically coupled to the second side, said second substrate formed of substantially the same material with substantially the same thickness as the first substrate, wherein said second substrate defines a second area that substantially matches the first area;

a second metal layer applied only to an inner surface of the second substrate, said inner surface of the second substrate characterized as oriented toward the second side, wherein the second metal layer has a thickness of between one micrometer (1 um) and twenty-five micrometer (25 um), and the second metal layer is formed of a metal suitable for bonding with a silver (Ag) based sintering paste;

a first lead frame interposed between the one or more electronic devices and the first substrate, said first lead frame having a surface material suitable for bonding with a silver (Ag) based sintering paste, wherein said first lead frame defines a first contact portion that corresponds to the first area of the first substrate, and a first lead portion that extends beyond the first area in a first direction;

a second lead frame interposed between the one or more electronic devices and the second substrate, said second lead frame having a surface material suitable for bonding with a silver (Ag) based sintering paste, wherein said second lead frame defines a second contact portion that corresponds to the second area of the second substrate, and a second lead portion that extends beyond the second area in a second direction distinct from the first direction;

a first paste layer of silver (Ag) based sintering paste interposed between the first substrate and the first lead frame, said first paste layer configured to form an electrical connection between the first substrate and the first lead frame;

a second paste layer of silver (Ag) based sintering paste interposed between the first lead frame and the one or more electronic devices, said second paste layer configured to form an electrical connection between the first lead frame and electrodes on the first side of the one or more devices;

a third paste layer of silver (Ag) based sintering paste interposed between the second lead frame and the one or more electronic devices, said third paste layer configured to form an electrical connection between the second lead frame and electrodes on the second side of the one or more electronic devices; and a fourth paste layer of silver (Ag) based sintering paste interposed between the second substrate and the second lead frame, said fourth paste layer configured to form an electrical connection between the second substrate and the second lead frame.

2. The assembly in accordance with claim 1, wherein the assembly is formed by arranging the one or more electronic devices, the substrates with the respective metal layers already applied, the lead frames, and the paste layers to form a stack; heating the stack to a temperature between two hundred degrees Celsius (200° C.) and three hundred degrees Celsius (300° C.), and then cooling the stack to a temperature less than one-hundred-twenty-five degrees Celsius (125° C.).

3. The assembly in accordance with claim 2, wherein the assembly is also formed by applying a force to the stack suitable to promote sintering of the paste layers when the temperature of the stack is between two hundred degrees Celsius (200° C.) and three hundred degrees Celsius (300° C.).

4. The assembly in accordance with claim 3, wherein the force generates a pressure less than thirty mega-Pascal (30 MPa).

5. The assembly in accordance with claim 1, wherein the material and thicknesses of the substrates and lead frames are selected so stress experienced by the one or more electronic devices caused by changes in temperature of the assembly are balanced from the center of the assembly, thereby eliminating the need for balancing stresses at a substrate level by applying substantially matching metal layers to both sides of the substrates.

6. The assembly in accordance with claim 1, wherein the first lead frame and the second lead frame comprise one of silver (Ag) plated copper (Cu), and silver (Ag) plated aluminum (Al), and the thickness of the first lead frame and the second lead frame is between one-hundred micrometers (100 μm or 0.1 mm) and five-hundred micrometers (500 μm or 0.5 mm).

* * * * *